(12) United States Patent
Tsuchiya et al.

(10) Patent No.: US 7,916,431 B2
(45) Date of Patent: Mar. 29, 2011

(54) MAGNETORESISTIVE ELEMENT INCLUDING INSULATING FILM TOUCHING PERIPHERY OF SPACER LAYER

(75) Inventors: Yoshihiro Tsuchiya, Tokyo (JP); Tomohito Mizuno, Tokyo (JP); Shinji Hara, Tokyo (JP); Daisuke Miyauchi, Tokyo (JP); Takahiko Machita, Tokyo (JP)

(73) Assignee: TDK Corporation, Tokyo (JP)

( * ) Notice: Subject to any disclaimer, the term of this patent is extended or adjusted under 35 U.S.C. 154(b) by 853 days.

(21) Appl. No.: 11/892,771

(22) Filed: Aug. 27, 2007

(65) Prior Publication Data

US 2009/0059443 A1 Mar. 5, 2009

(51) Int. Cl.
*G11B 5/39* (2006.01)
*G11B 5/31* (2006.01)

(52) U.S. Cl. .................. 360/324.1; 360/324.2

(58) Field of Classification Search ........ 360/324–324.2
See application file for complete search history.

(56) References Cited

U.S. PATENT DOCUMENTS

| | | | | |
|---|---|---|---|---|
| 7,057,859 | B2 * | 6/2006 | Kagami et al. | 360/317 |
| 7,072,153 | B2 | 7/2006 | Koui et al. | |
| 7,218,483 | B2 | 5/2007 | Yuasa et al. | |
| 7,715,156 | B2 * | 5/2010 | Hirata et al. | 360/324.2 |
| 2004/0008452 | A1 * | 1/2004 | Kagami et al. | 360/318 |
| 2006/0067010 | A1 | 3/2006 | Kagami et al. | |
| 2006/0093862 | A1 * | 5/2006 | Parkin | 428/811.1 |
| 2006/0209472 | A1 | 9/2006 | Koui et al. | |

FOREIGN PATENT DOCUMENTS

| | | |
|---|---|---|
| JP | A 2003-008102 | 1/2003 |
| JP | A 2003-298143 | 10/2003 |
| JP | A 2004-326853 | 11/2004 |
| JP | A 2005-018887 | 1/2005 |
| JP | A 2005-135514 | 5/2005 |
| JP | A 2006-261306 | 9/2006 |

OTHER PUBLICATIONS

Yoshihiro Tsuchiya et al., U.S. Appl. No. 11/698,180, filed Jan. 26, 2007.

* cited by examiner

*Primary Examiner* — William J Klimowicz
(74) *Attorney, Agent, or Firm* — Oliff & Berridge, PLC

(57) ABSTRACT

An MR element includes a stack of layers including a first ferromagnetic layer, a second ferromagnetic layer, and a spacer layer disposed between the first and the second ferromagnetic layer. The stack of layers has an outer surface, and the spacer layer has a periphery located in the outer surface of the stack of layers. The magnetoresistive element further includes an insulating film that touches the periphery of the spacer layer. The spacer layer includes a layer made of an oxide semiconductor composed of an oxide of a first metal. The insulating film includes a contact film that touches the periphery of the spacer layer and that is made of an oxide of a second metal having a Pauling electronegativity lower than that of the first metal by 0.1 or more.

9 Claims, 6 Drawing Sheets

MAGNETORESISTIVE ELEMENT INCLUDING INSULATING FILM TOUCHING PERIPHERY OF SPACER LAYER

BACKGROUND OF THE INVENTION

1. Field of the Invention

The present invention relates to a magnetoresistive element, a thin-film magnetic head including the magnetoresistive element and a method of manufacturing the same, and to a head assembly and a magnetic disk drive each including the magnetoresistive element.

2. Description of the Related Art

Performance improvements in thin-film magnetic heads have been sought as areal recording density of magnetic disk drives has increased. A widely used type of thin-film magnetic head is a composite thin-film magnetic head that has a structure in which a write head having an induction-type electromagnetic transducer for writing and a read head having a magnetoresistive element (that may be hereinafter referred to as MR element) for reading are stacked on a substrate.

MR elements include GMR (giant magnetoresistive) elements utilizing a giant magnetoresistive effect, and TMR (tunneling magnetoresistive) elements utilizing a tunneling magnetoresistive effect.

Read heads are required to have characteristics of high sensitivity and high output. As the read heads that satisfy such requirements, those employing spin-valve GMR elements or TMR elements have been mass-produced.

A spin-valve GMR element typically includes a free layer, a pinned layer, a nonmagnetic conductive layer disposed between the free layer and the pinned layer, and an antiferromagnetic layer disposed on a side of the pinned layer farther from the nonmagnetic conductive layer. The free layer is a ferromagnetic layer having a direction of magnetization that changes in response to a signal magnetic field. The pinned layer is a ferromagnetic layer having a fixed direction of magnetization. The antiferromagnetic layer is a layer that fixes the direction of magnetization of the pinned layer by means of exchange coupling with the pinned layer.

Conventional GMR heads have a structure in which a current used for detecting magnetic signals (hereinafter referred to as a sense current) is fed in the direction parallel to the planes of the layers constituting the GMR element. Such a structure is called a CIP (current-in-plane) structure. On the other hand, developments have been pursued for another type of GMR heads having a structure in which the sense current is fed in a direction intersecting the planes of the layers constituting the GMR element, such as the direction perpendicular to the planes of the layers constituting the GMR element. Such a structure is called a CPP (current-perpendicular-to-plane) structure. A GMR element used for read heads having the CPP structure is hereinafter called a CPP-GMR element. A GMR element used for read heads having the CIP structure is hereinafter called a CIP-GMR element.

In recent years, with an increase in recording density, there have been increasing demands for a reduction in track width of a read head. A reduction in track width of a read head is achievable by reducing the width of the MR element. A reduction in width of the MR element leads to a reduction in length of the MR element taken in the direction perpendicular to the medium facing surface of the thin-film magnetic head. This results in a reduction in area of each of the top surface and the bottom surface of the MR element.

In a read head of the CIP structure, since shield gap films separate the CIP-GMR element from respective shield layers, a reduction in areas of the top and bottom surfaces of the CIP-GMR element results in a reduction in heat dissipation efficiency. Consequently, the read head of this type has a problem that the operating current is limited so as to ensure reliability.

In a read head of the CPP structure, in contrast, no shield gap films are required, and there are provided electrode layers touching the top surface and the bottom surface of the CPP-GMR element, respectively. The electrode layers can also function as shield layers. The read head of the CPP structure is capable of solving the above-mentioned problem of the read head of the CIP structure. In the read head of the CPP structure, high heat dissipation efficiency is achieved since the electrode layers touch the top surface and the bottom surface of the CPP-GMR element. Consequently, in the read head of this type it is possible to increase the operating current. Furthermore, in the read head of this type, the smaller the areas of the top surface and the bottom surface of the GPP-GMR element, the higher is the resistance of the element and accordingly the greater is the magnetoresistance change amount. The read head of this type therefore allows a reduction in track width.

A typical CPP-GMR element, however, has a disadvantage that it is not satisfactorily high in magnetoresistance change ratio (hereinafter referred to as MR ratio), which is a ratio of magnetoresistance change with respect to the resistance of the element. This is presumably because scattering of spin-polarized electrons occurs and spin information is lost at the interface between the nonmagnetic conductive layer and a magnetic layer or in the nonmagnetic conductive layer.

Additionally, a CPP-GMR element is low in resistance, and is small in resistance change amount, accordingly. Consequently, in order to obtain a higher read output with a CPP-GMR element, it is necessary to increase the voltage applied to the element. An increase in the voltage applied to the element would raise the following problem, however. In a CPP-GMR element, a current is fed in the direction perpendicular to the plane of each layer. This causes spin-polarized electrons to be injected from the free layer into the pinned layer or from the pinned layer into the free layer. In the free layer or the pinned layer the spin-polarized electrons generate a torque that rotates the magnetization of the layer, that is, a spin torque. The spin torque is proportional to the current density. An increase in the voltage applied to the CPP-GMR element causes an increase in current density, thereby resulting in an increase in spin torque. An increase in spin torque results in a problem that the direction of magnetization of the pinned layer is changed, or a problem that the free layer becomes unable to freely change the direction of magnetization thereof in response to an external magnetic field. To cope with this, as described below, consideration has been given to increasing the resistance change amount of a CPP-GMR element by increasing the resistance of the CPP-GMR element.

JP 2003-008102A discloses a CPP-GMR element including: a pinned layer whose direction of magnetization is pinned; a free layer whose direction of magnetization changes in response to an external magnetic field; a nonmagnetic metal intermediate layer provided between the pinned layer and the free layer; and a resistance adjustment layer provided between the pinned layer and the free layer and made of a material containing conductive carriers not more than $10^{22}/cm^3$. JP 2003-008102A discloses that the material of the resistance adjustment layer is preferably a semiconductor or a semimetal.

JP 2003-298143A discloses an MR element of the CPP structure including a pinned layer whose direction of magnetization is pinned, a free layer whose direction of magnetization changes in response to an external magnetic field, and an intermediate layer located between the pinned layer and the free layer, wherein the intermediate layer includes a first layer (an intermediate oxide layer) made of an oxide and having a region in which the resistance is relatively high and a region in which the resistance is relatively low, and wherein, when a sense current passes through the first layer, the sense current preferentially flows through the region in which the resistance is relatively low. JP 2003-298143A discloses that the sense current has an ohmic characteristic when passing through the first layer. Therefore, the MR element disclosed in this publication is not a TMR element but a CPP-GMR element. Such a CPP-GMR element is called a current-confined-path type CPP-GMR element, for example. JP 2003-298143A further discloses that the intermediate layer further includes a second layer (an interface adjusting intermediate layer) made of a nonmagnetic metal that is disposed between the first layer and the pinned layer, and between the first layer and the free layer.

JP 2006-261306A also discloses a current-confined-path type CPP-GMR element. This CPP-GMR element includes an intermediate layer disposed between the pinned layer and the free layer. The intermediate layer includes an insulating film, and a columnar metal conduction portion formed within the insulating film. The CPP-GMR element further includes a compound layer formed between the metal conduction portion and one of the pinned layer and the free layer. The compound layer includes a compound having an ionic binding or covalent binding property. For example, a III-V semiconductor, a II-VI semiconductor or an oxide semiconductor is used as the material of the compound layer.

For a CPP-GMR element, providing a spacer layer including a layer made of a semiconductor between the free layer and the pinned layer is considered to be advantageous in suppressing spin toque while making the resistance of the CPP-GMR element be of an appropriate value and increasing the resistance change amount of the CPP-GMR element.

However, when a thin-film magnetic head including a read head and a write head was actually fabricated using, for the read head, a CPP-GMR element with a spacer layer including a layer made of an oxide semiconductor, a problem was found, that is, a great reduction in MR ratio was found to occur when heat was applied to the CPP-GMR element after fabrication of the element. Occasions when heat is applied to the element after its fabrication include, for example, heat treatment performed for hardening photoresist covering the coil in the process of fabricating the write head, and heating performed in a reliability test on the thin-film magnetic head.

The above-mentioned phenomenon in which the MR ratio is greatly reduced when heat is applied to the element after its fabrication did not occur in a typical CPP-GMR element.

Typically, in a GMR element, bias magnetic field applying layers for applying a bias magnetic field to the free layer are respectively provided on both sides in a track width direction of a stack of the layers constituting the element. Furthermore, on the peripheral surface of the stack of the layers, an insulating layer is provided for insulating the stack of the layers from the bias magnetic field applying layers. A CPP-GMR element having such a configuration is disclosed in, for example, JP 2005-135514A. JP 2005-135514A teaches using $Al_2O_3$ as the material of the foregoing insulating layer.

A CIP-GMR element having an insulating layer disposed on the peripheral surface of the stack of the layers is disclosed in, for example, JP 2004-326853A and JP 2005-018887A. These publications teach using $Al_2O_3$ and $SiO_2$ as the material of the foregoing insulating layer.

OBJECT AND SUMMARY OF THE INVENTION

It is an object of the present invention to provide a magnetoresistive element having a spacer layer including a layer made of an oxide semiconductor, the magnetoresistive element being capable of suppressing a reduction in MR ratio occurring when heat is applied to the element after its fabrication, and to provide a thin-film magnetic head including this magnetoresistive element and a method of manufacturing the same, and a head assembly and a magnetic disk drive each including the magnetoresistive element.

A magnetoresistive element of the present invention includes a stack of layers including a first ferromagnetic layer, a second ferromagnetic layer, and a spacer layer disposed between the first ferromagnetic layer and the second ferromagnetic layer. In this magnetoresistive element, a current for detecting magnetic signals is fed in a direction intersecting the plane of each of the foregoing layers. The stack of layers has an outer surface, and the spacer layer has a periphery located in the outer surface of the stack of layers. The magnetoresistive element further includes an insulating film that touches the periphery of the spacer layer. The spacer layer includes a layer made of an oxide semiconductor composed of an oxide of a first metal. The insulating film includes a contact film that touches the periphery of the spacer layer and that is made of an oxide of a second metal having a Pauling electronegativity lower than that of the first metal by 0.1 or more.

In the magnetoresistive element of the invention, the first ferromagnetic layer may be a free layer having a direction of magnetization that changes in response to an external magnetic field, while the second ferromagnetic layer may be a pinned layer having a fixed direction of magnetization.

In the magnetoresistive element of the invention, the second metal may be composed of at least one of Hf, Mg, Zr, Ta and Ti.

In the magnetoresistive element of the invention, the first metal may be composed of at least one of Zn, In and Sn. In this case, the second metal may be composed of at least one of Hf, Mg, Zr, Ta and Ti.

In the magnetoresistive element of the invention, the insulating film may further include an inorganic insulating film made of an inorganic insulating material and disposed such that the contact film is sandwiched between the inorganic insulating film and the periphery of the spacer layer.

In the magnetoresistive element of the invention, the contact film may have a thickness of 1 nm or greater.

A first thin-film magnetic head of the present invention includes: a medium facing surface that faces toward a recording medium; the magnetoresistive element of the invention disposed near the medium facing surface to detect a signal magnetic field sent from the recording medium; and a pair of electrodes for feeding a current for detecting magnetic signals to the magnetoresistive element.

A second thin-film magnetic head of the present invention includes a medium facing surface that faces toward a recording medium, a read head, and a write head. The read head includes the magnetoresistive element of the invention disposed near the medium facing surface to detect a signal magnetic field sent from the recording medium, and a pair of electrodes for feeding a current for detecting magnetic signals to the magnetoresistive element.

A manufacturing method for a thin-film magnetic head of the present invention is a method for manufacturing the second thin-film magnetic head of the invention. The method includes the steps of forming the read head and forming the write head after the read head is formed, wherein the step of forming the write head includes the step of performing heat treatment.

A head assembly of the present invention includes: a slider including the first thin-film magnetic head of the invention and disposed to face toward a recording medium; and a supporter flexibly supporting the slider.

A magnetic disk drive of the present invention includes: a slider including the first thin-film magnetic head of the invention and disposed to face toward a recording medium that is driven to rotate; and an alignment device supporting the slider and aligning the slider with respect to the recording medium.

According to the present invention, the magnetoresistive element includes the stack of layers including the first and the second ferromagnetic layer and the spacer layer disposed therebetween, and the insulating film that touches the periphery of the spacer layer. The spacer layer includes a layer made of an oxide semiconductor composed of an oxide of the first metal. The insulating film includes the contact film that touches the periphery of the spacer layer and that is made of an oxide of the second metal having a Pauling electronegativity lower than that of the first metal by 0.1 or more. According to the present invention, it is thus possible to suppress transfer of oxygen from the layer made of an oxide semiconductor to the insulating film, and consequently it is possible to suppress a reduction in MR ratio occurring when heat is applied to the magnetoresistive element after its fabrication.

Other and further objects, features and advantages of the invention will appear more fully from the following description.

DETAILED DESCRIPTION OF THE PREFERRED EMBODIMENT

Figure 3:
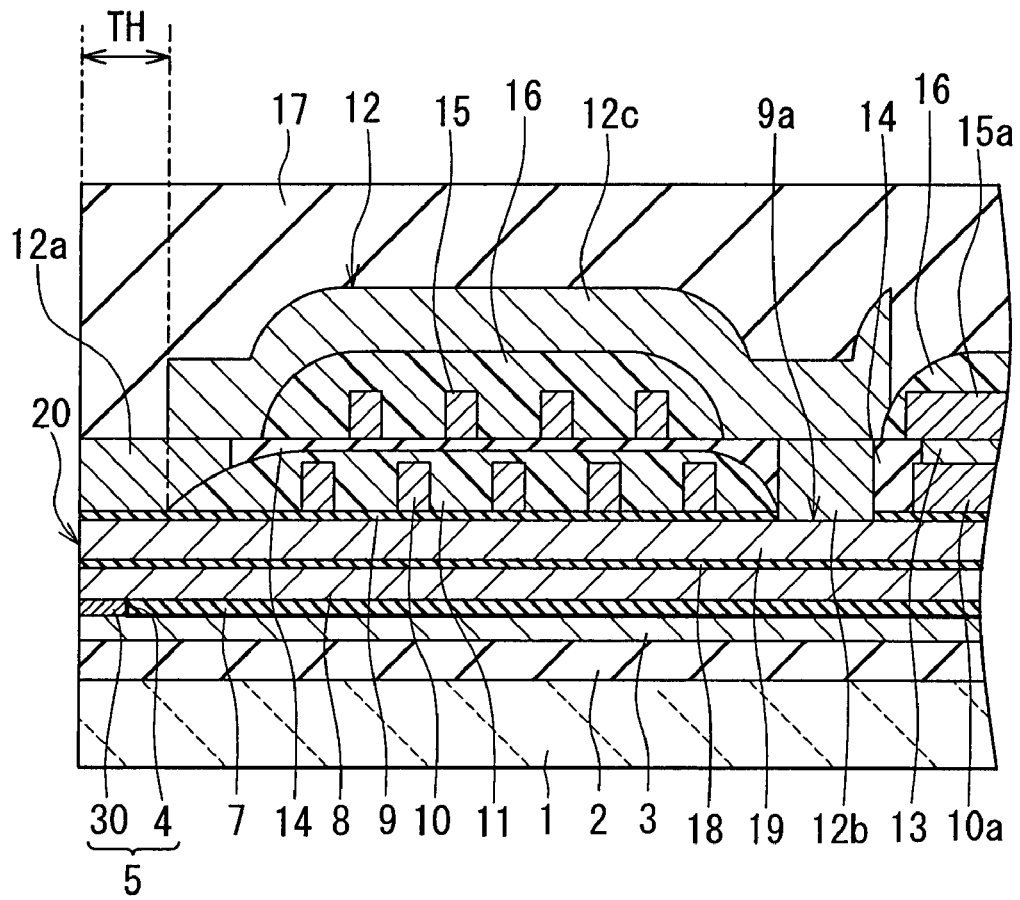
FIG. 3 is a cross-sectional view illustrating a cross section of a thin-film magnetic head of the embodiment of the invention perpendicular to the medium facing surface and the substrate.
Figure 4:
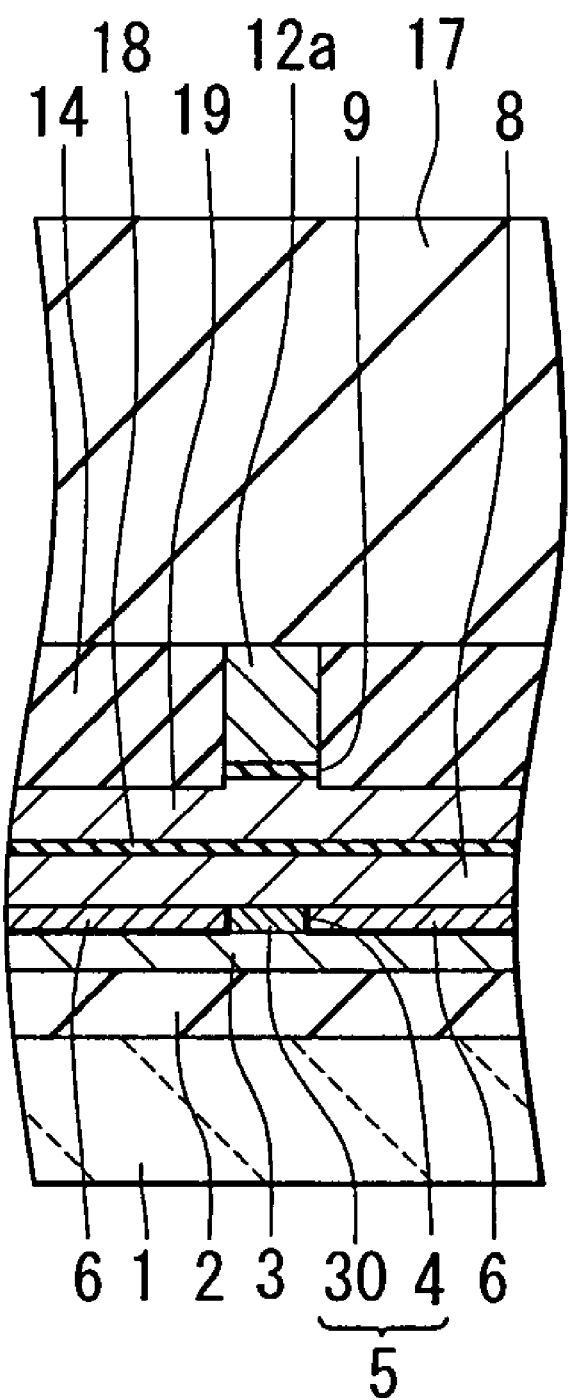
FIG. 4 is a cross-sectional view illustrating a cross section of a pole portion of the thin-film magnetic head of the embodiment of the invention parallel to the medium facing surface.

An embodiment of the present invention will now be described in detail with reference to the drawings. Reference is first made to FIG. 3 and FIG. 4 to outline the configuration and a manufacturing method of a thin-film magnetic head of the embodiment of the invention. FIG. 3 is a cross-sectional view illustrating a cross section of the thin-film magnetic head perpendicular to the medium facing surface and the substrate. FIG. 4 is a cross-sectional view illustrating a cross section of a pole portion of the thin-film magnetic head parallel to the medium facing surface.

The thin-film magnetic head of the embodiment has a medium facing surface 20 that faces toward a recording medium. Furthermore, the thin-film magnetic head includes: a substrate 1 made of a ceramic material such as aluminum oxide and titanium carbide ($Al_2O_3$—TiC); an insulating layer 2 made of an insulating material such as alumina ($Al_2O_3$) and disposed on the substrate 1; a first shield layer 3 made of a magnetic material and disposed on the insulating layer 2; and an MR element 5 disposed on the first shield layer 3. The MR element 5 includes a stack of layers 30 and an insulating film 4. Detailed descriptions on the stack of layers 30 and the insulating film 4 will be provided later.

The magnetic head further includes: two bias magnetic field applying layers 6 respectively disposed adjacent to two side surfaces of the stack of layers 30 with the insulating film 4 in between; and an insulating layer 7 disposed around the stack of layers 30 and the bias magnetic field applying layers 6. The MR element 5 is disposed near the medium facing surface 20. The insulating layer 7 is made of an insulating material such as alumina.

The thin-film magnetic head further includes: a second shield layer 8 made of a magnetic material and disposed on the MR element 5, the bias magnetic field applying layers 6 and the insulating layer 7; a separating layer 18 made of a nonmagnetic material such as alumina and disposed on the second shield layer 8; and a bottom pole layer 19 made of a magnetic material and disposed on the separating layer 18. The magnetic material used for the second shield layer 8 and the bottom pole layer 19 is a soft magnetic material such as NiFe, CoFe, CoFeB, CoFeNi or FeN. Alternatively, a second shield layer that also functions as a bottom pole layer may be provided in place of the second shield layer 8, the separating layer 18 and the bottom pole layer 19.

The thin-film magnetic head further includes a write gap layer 9 made of a nonmagnetic material such as alumina and disposed on the bottom pole layer 19. A contact hole 9a is formed in a region of the write gap layer 9 away from the medium facing surface 20.

The thin-film magnetic head further includes a first layer portion 10 of a thin-film coil disposed on the write gap layer 9. The first layer portion 10 is made of a conductive material such as copper (Cu). In FIG. 3, numeral 10a indicates a connecting portion of the first layer portion 10 connected to a second layer portion 15 of the thin-film coil to be described later. The first layer portion 10 is wound around the contact hole 9a.

The thin-film magnetic head further includes: an insulating layer 11 made of an insulating material and disposed to cover the first layer portion 10 of the thin-film coil and the write gap layer 9 around the first layer portion 10; a top pole layer 12 made of a magnetic material; and a connecting layer 13 made of a conductive material and disposed on the connecting portion 10a. The connecting layer 13 may be made of a magnetic material. Each of the outer and the inner edge portion of the insulating layer 11 is in the shape of a rounded slope.

The top pole layer 12 includes a track width defining layer 12a, a coupling portion layer 12b and a yoke portion layer 12c. The track width defining layer 12a is disposed on the write gap layer 9 and the insulating layer 11 over a region extending from a sloped portion of the insulating layer 11 closer to the medium facing surface 20 to the medium facing surface 20. The track width defining layer 12a includes: a front-end portion that is formed on the write gap layer 9 and functions as the pole portion of the top pole layer 12; and a connecting portion that is formed on the sloped portion of the insulating layer 11 closer to the medium facing surface 20 and is connected to the yoke portion layer 12c. The front-end portion has a width equal to the write track width. The connecting portion has a width greater than the width of the front-end portion.

The coupling portion layer 12b is disposed on a region of the bottom pole layer 19 where the contact hole 9a is formed. The yoke portion layer 12c couples the track width defining layer 12a and the coupling portion layer 12b to each other. An end of the yoke portion layer 12c that is closer to the medium facing surface 20 is located apart from the medium facing surface 20. The yoke portion layer 12c is connected to the bottom pole layer 19 through the coupling portion layer 12b.

The thin-film magnetic head further includes an insulating layer 14 made of an inorganic insulating material such as alumina and disposed around the coupling portion layer 12b. The track width defining layer 12a, the coupling portion layer 12b, the connecting layer 13 and the insulating layer 14 have flattened top surfaces.

The thin-film magnetic head further includes the second layer portion 15 of the thin-film coil disposed on the insulating layer 14. The second layer portion 15 is made of a conductive material such as copper (Cu). In FIG. 3, numeral 15a indicates a connecting portion of the second layer portion 15 that is connected to the connecting portion 10a of the first layer portion 10 of the thin-film coil through the connecting layer 13. The second layer portion 15 is wound around the coupling portion layer 12b.

The thin-film magnetic head further includes an insulating layer 16 disposed to cover the second layer portion 15 of the thin-film coil and the insulating layer 14 around the second layer portion 15. Each of the outer and the inner edge portion of the insulating layer 16 is in the shape of a rounded slope. Part of the yoke portion layer 12c is disposed on the insulating layer 16.

The thin-film magnetic head further includes an overcoat layer 17 disposed to cover the top pole layer 12. The overcoat layer 17 is made of alumina, for example.

The method of manufacturing the thin-film magnetic head of the embodiment will now be outlined. In the method of manufacturing the thin-film magnetic head of the embodiment, first, the insulating layer 2 is formed to have a thickness of 0.2 to 5 μm, for example, on the substrate 1 by sputtering or the like. Next, on the insulating layer 2, the first shield layer 3 is formed into a predetermined pattern by plating, for example. Next, although not shown, an insulating layer made of alumina, for example, is formed over the entire surface. Next, the insulating layer is polished by chemical mechanical polishing (hereinafter referred to as CMP), for example, until the first shield layer 3 is exposed, and the top surfaces of the first shield layer 3 and the insulating layer are thereby flattened.

Next, the MR element 5, the two bias magnetic field applying layers 6 and the insulating layer 7 are formed on the first shield layer 3. Next, the second shield layer 8 is formed on the MR element 5, the bias magnetic field applying layers 6 and the insulating layer 7. The second shield layer 8 is formed by plating or sputtering, for example. Next, the separating layer 18 is formed on the second shield layer 8 by sputtering, for example. Next, the bottom pole layer 19 is formed on the separating layer 18 by plating or sputtering, for example.

Next, the write gap layer 9 is formed to have a thickness of 50 to 300 nm, for example, on the bottom pole layer 19 by sputtering or the like. Next, in order to make a magnetic path, the contact hole 9a is formed by partially etching the write gap layer 9 at a center portion of the thin-film coil that will be formed later.

Next, the first layer portion 10 of the thin-film coil is formed to have a thickness of 2 to 3 μm, for example, on the write gap layer 9. The first layer portion 10 is wound around the contact hole 9a.

Next, the insulating layer 11 made of an organic insulating material is formed into a predetermined pattern to cover the first layer portion 10 of the thin-film coil and the write gap layer 9 disposed around the first layer portion 10. The organic insulating material used for the insulating layer 11 is a material that exhibits fluidity with an increase in temperature and thereafter hardens, which may be photoresist, for example. Next, the insulating layer 11 is heat-treated at a temperature of, e.g., 250° C., so as to flatten the surface of the insulating layer 11 and to harden the insulating layer 11. Through this heat treatment, the outer and the inner edge portion of the insulating layer 11 are each brought into the shape of a rounded slope.

Next, the track width defining layer 12a of the top pole layer 12 is formed on the write gap layer 9 and the insulating layer 11 over the region extending from the sloped portion of the insulating layer 11 closer to the medium facing surface 20 described later to the medium facing surface 20.

When the track width defining layer 12a is formed, the coupling portion layer 12b is formed on the region of the bottom pole layer 19 where the contact hole 9a is formed, and the connecting layer 13 is formed on the connecting portion 10a at the same time.

Next, pole trimming is performed. That is, in a region around the track width defining layer 12a, the write gap layer 9 and at least part of the pole portion of the bottom pole layer 19 close to the write gap layer 9 are etched using the track width defining layer 12a as a mask. This provides a trim structure in which, as shown in FIG. 4, the pole portion of the top pole layer 12, the write gap layer 9, and at least part of the pole portion of the bottom pole layer 19 have equal widths. The trim structure allows prevention of an increase in effective track width resulting from an expansion of magnetic flux near the write gap layer 9.

Next, the insulating layer 14 is formed to have a thickness of 3 to 4 μm, for example, over the entire top surface of a stack of the layers that have been formed through the foregoing steps. Next, the insulating layer 14 is polished by CMP, for example, to reach the surfaces of the track width defining layer 12a, the coupling portion layer 12b and the connecting layer 13, and is thereby flattened.

Next, the second layer portion 15 of the thin-film coil is formed to have a thickness of 2 to 3 μm, for example, on the insulating layer 14 that has been flattened. The second layer portion 15 is wound around the coupling portion layer 12b.

Next, the insulating layer 16 made of an organic insulating material is formed into a predetermined pattern to cover the second layer portion 15 of the thin-film coil and the insulating layer 14 disposed around the second layer portion 15. The organic insulating material used for the insulating layer 16 is a material that exhibits fluidity with an increase in temperature and thereafter hardens, which may be photoresist, for example. Next, the insulating layer 16 is heat-treated at a temperature of, e.g., 250° C., so as to flatten the surface of the insulating layer 16 and to harden the insulating layer 16. Through this heat treatment, the outer and the inner edge portion of the insulating layer 16 are each brought into the shape of a rounded slope. Next, the yoke portion layer 12c is formed on the track width defining layer 12a, the insulating layers 14 and 16 and the coupling portion layer 12b.

Next, the overcoat layer 17 is formed to cover the entire top surface of a stack of the layers that have been formed through the foregoing steps. Wiring, terminals and so on are then formed on the overcoat layer 17. Finally, machining of the slider including the foregoing layers is performed to form the medium facing surface 20. The thin-film magnetic head including a write head and a read head is thus completed.

As described above, this embodiment includes the step of forming the read head and the step of forming the write head after the read head is formed. The step of forming the write head includes the step of performing heat treatment.

The thin-film magnetic head manufactured in this manner has the medium facing surface 20 that faces toward the recording medium, the read head, and the write head. The read head is disposed near the medium facing surface 20 to detect a signal magnetic field sent from the recording medium. The configuration of the read head will be described in detail later.

The write head includes: the bottom pole layer 19 and the top pole layer 12 magnetically coupled to each other and including the respective pole portions that are opposed to each other and placed in regions of the pole layers on a side of the medium facing surface 20; the write gap layer 9 provided between the pole portion of the bottom pole layer 19 and the pole portion of the top pole layer 12; and the thin-film coil 10, 15 at least part of which is placed between the bottom pole layer 19 and the top pole layer 12 and insulated from the bottom pole layer 19 and the top pole layer 12. In this thin-film magnetic head, as illustrated in FIG. 3, the length from the medium facing surface 20 to the end of the insulating layer 11 closer to the medium facing surface 20 corresponds to throat height TH. Note that the throat height refers to a length (height) from the medium facing surface 20 to a point at which the distance between the two pole layers starts to increase. It should be noted that, while FIG. 3 and FIG. 4 illustrate a write head for use with the longitudinal magnetic recording system, the write head of the embodiment can be one for use with the perpendicular magnetic recording system.

Figure 1:
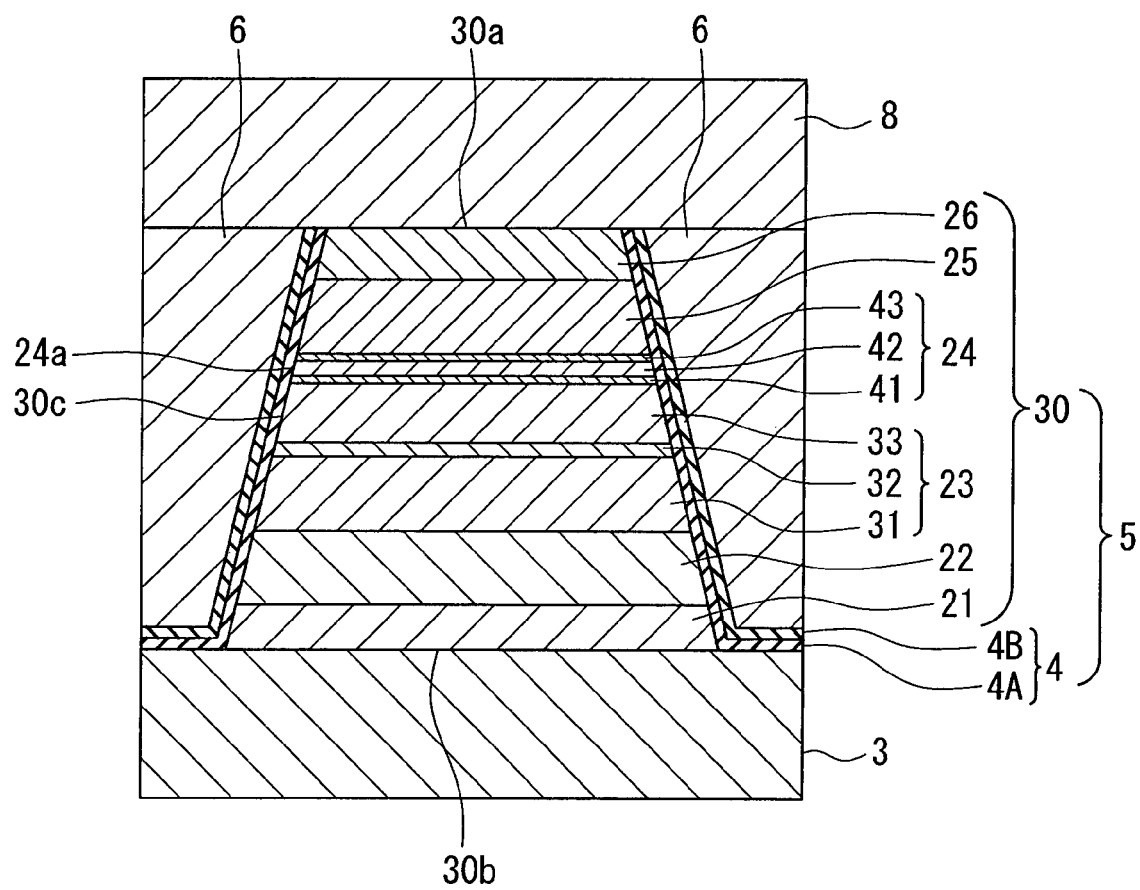
FIG. 1 is a cross-sectional view illustrating a cross section of a read head including an MR element of an embodiment of the invention parallel to the medium facing surface.
Figure 2:
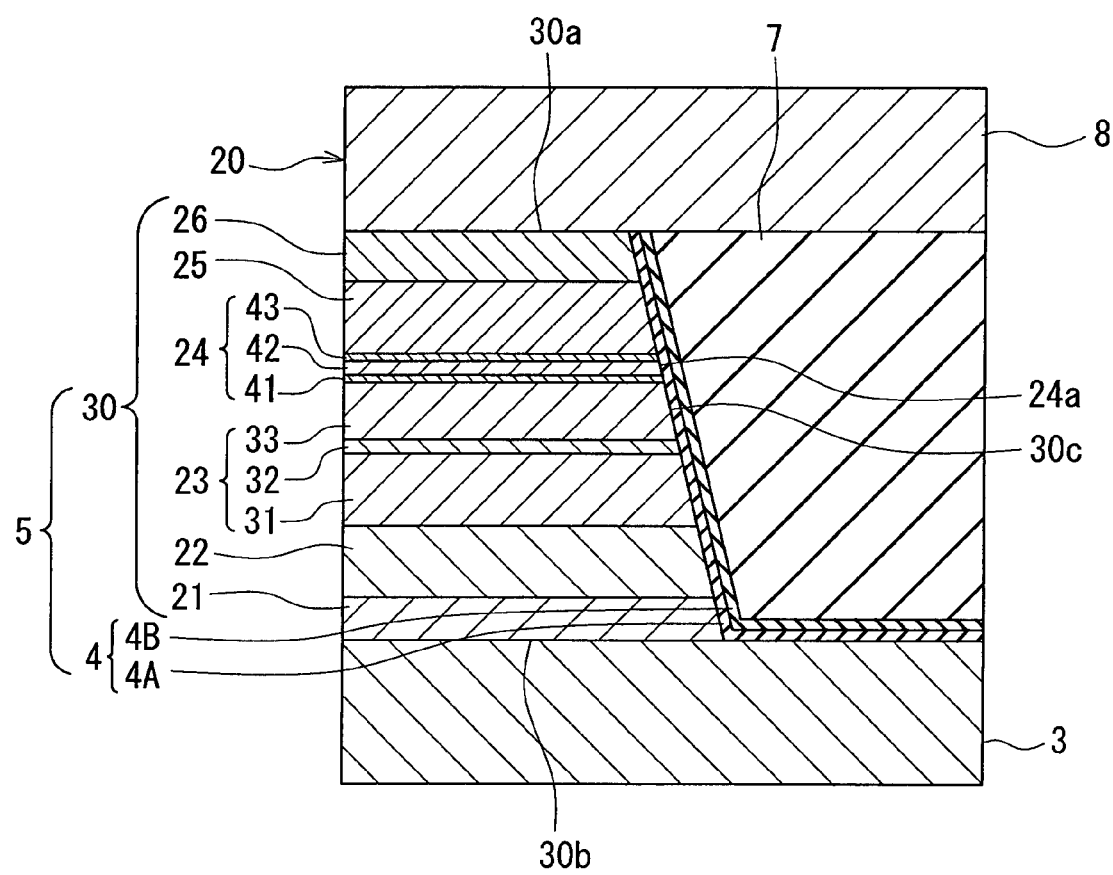
FIG. 2 is a cross-sectional view illustrating a cross section of the read head including the MR element of the embodiment of the invention perpendicular to the medium facing surface and the substrate.

Reference is now made to FIG. 1 and FIG. 2 to describe the configuration of the read head of the embodiment in detail. FIG. 1 is a cross-sectional view illustrating a cross section of the read head parallel to the medium facing surface. As illustrated in FIG. 1, the read head includes the first shield layer 3 and the second shield layer 8 disposed at a specific distance from each other, and the MR element 5 disposed between the first shield layer 3 and the second shield layer 8. The MR element 5 and the second shield layer 8 are stacked on the first shield layer 3. The MR element 5 includes the stack of layers 30 and the insulating film 4. The stack of layers 30 has an outer surface including a top surface 30a, a bottom surface 30b, and a peripheral surface 30c that connects the top surface 30a and the bottom surface 30b to each other. The peripheral surface 30c of the stack of layers 30 includes an end face located in the medium facing surface 20, an end face opposite to the medium facing surface 20, and two side surfaces that couple these two end faces to each other. The insulating film 4 touches the two side surfaces and the end face opposite to the medium facing surface 20 of the peripheral surface 30c of the stack of layers 30, and does not touch the end face located in the medium facing surface 20.

The read head further includes: the two bias magnetic field applying layers 6 that are respectively disposed adjacent to the two side surfaces of the stack of layers 30 with the insulating film 4 in between and that apply a bias magnetic field to the stack of layers 30; and the insulating layer 7 disposed around the stack of layers 30 and the bias magnetic field applying layers 6. As illustrated in FIG. 1 and FIG. 2, the insulating film 4 is located between the peripheral surface 30c of the stack of layers 30 and the bias magnetic field applying layers 6, between the first shield 3 and the bias magnetic field applying layers 6, between the peripheral surface 30c of the stack of layers 30 and the insulating layer 7, and between the first shield layer 3 and the insulating layer 7.

The bias magnetic field applying layers 6 are each composed of a hard magnetic layer (hard magnet) or a stack of a ferromagnetic layer and an antiferromagnetic layer, for example. To be specific, the bias magnetic field applying layers 6 are made of CoPt or CoCrPt, for example.

The MR element 5 of the embodiment is a CPP-GMR element. In this MR element 5, a sense current, which is a current for detecting magnetic signals, is fed in a direction intersecting the planes of layers constituting the stack of layers 30, such as the direction perpendicular to the planes of the layers constituting the stack of layers 30. The first shield layer 3 and the second shield layer 8 also function as a pair of electrodes for feeding the sense current to the MR element 5 in a direction intersecting the planes of the layers constituting the stack of layers 30, such as the direction perpendicular to the planes of the layers constituting the stack of layers 30. Alternatively, besides the first shield layer 3 and the second shield layer 8, there may be provided a pair of electrodes on top and bottom of the stack of layers 30, respectively. The MR element 5 has a resistance that changes in response to an external magnetic field, that is, a signal magnetic field sent from the recording medium. The resistance of the MR element 5 can be determined from the sense current. It is thus possible to read data stored on the recording medium through the use of the read head.

FIG. 1 and FIG. 2 illustrate an example of configuration of the MR element 5. As previously mentioned, the MR element 5 includes the stack of layers 30. The stack of layers 30 includes: a free layer 25 that is a ferromagnetic layer having a direction of magnetization that changes in response to the signal magnetic field; a pinned layer 23 that is a ferromagnetic layer having a fixed direction of magnetization; and a spacer layer 24 disposed between the free layer 25 and the pinned layer 23. The free layer 25 corresponds to the first ferromagnetic layer of the present invention, while the pinned layer 23 corresponds to the second ferromagnetic layer of the present invention. In the example illustrated in FIG. 1 and FIG. 2, the pinned layer 23 is disposed closer to the first shield layer 3 than is the free layer 25. However, such a configuration is also possible that the free layer 25 is disposed closer to the first shield layer 3 instead.

The stack of layers 30 further includes: an antiferromagnetic layer 22 disposed on a side of the pinned layer 23 farther from the spacer layer 24; an underlying layer 21 disposed between the first shield layer 3 and the antiferromagnetic layer 22; and a protection layer 26 disposed between the free layer 25 and the second shield layer 8. In the MR element 5 illustrated in FIG. 1 and FIG. 2, the underlying layer 21, the antiferromagnetic layer 22, the pinned layer 23, the spacer layer 24, the free layer 25 and the protection layer 26 are stacked in this order on the first shield layer 3.

The antiferromagnetic layer 22 is a layer for fixing the direction of magnetization of the pinned layer 23 by means of exchange coupling with the pinned layer 23. The underlying layer 21 is provided for improving the crystallinity and orientability of each layer formed thereon and particularly for enhancing the exchange coupling between the antiferromagnetic layer 22 and the pinned layer 23. The protection layer 26 is a layer for protecting the layers located therebelow.

The underlying layer 21 has a thickness of 1 to 6 nm, for example. The underlying layer 21 is formed of a stack of a Ta layer and a Ru layer, for example.

The antiferromagnetic layer 22 has a thickness of 4 to 30 nm, for example. The antiferromagnetic layer 22 is made of an antiferromagnetic material containing Mn and at least one element $M_{II}$ selected from the group consisting of Pt, Ru, Rh, Pd, Ni, Cu, Ir, Cr and Fe, for example. The Mn content of the material is preferably equal to or higher than 35 atomic percent and lower than or equal to 95 atomic percent, while the content of the other element $M_{II}$ of the material is preferably equal to or higher than 5 atomic percent and lower than or equal to 65 atomic percent. There are two types of the antiferromagnetic material, one is a non-heat-induced antiferromagnetic material that exhibits antiferromagnetism without any heat treatment and induces an exchange coupling magnetic field between a ferromagnetic material and itself, and the other is a heat-induced antiferromagnetic material that exhibits antiferromagnetism by undergoing heat treatment. The antiferromagnetic layer 22 can be made of either of these types. Examples of the non-heat-induced antiferromagnetic material include a Mn alloy that has a γ phase, such as RuRhMn, FeMn, or IrMn. Examples of the heat-induced antiferromagnetic material include a Mn alloy that has a regular crystal structure, such as PtMn, NiMn, or PtRhMn.

As a layer for fixing the direction of magnetization of the pinned layer 23, a hard magnetic layer made of a hard magnetic material such as CoPt may be provided in place of the antiferromagnetic layer 22 described above. In this case, for example, Cr, CrTi or TiW is used as the material of the underlying layer 21.

In the pinned layer 23, the direction of magnetization is fixed by exchange coupling with the antiferromagnetic layer 22 at the interface between the antiferromagnetic layer 22 and the pinned layer 23. The pinned layer 23 of the embodiment is a so-called synthetic pinned layer, having an outer layer 31, a nonmagnetic middle layer 32 and an inner layer 33 that are stacked in this order on the antiferromagnetic layer 22. Each of the outer layer 31 and the inner layer 33 includes a ferromagnetic layer made of a ferromagnetic material containing at least Co selected from the group consisting of Co and Fe, for example. The outer layer 31 and the inner layer 33 are antiferromagnetic-coupled to each other via the nonmagnetic middle layer 32, and the magnetizations thereof are fixed to opposite directions. The outer layer 31 has a thickness of 2 to 7 nm, for example. The inner layer 33 has a thickness of 2 to 10 nm, for example.

The nonmagnetic middle layer 32 has a thickness of 0.35 to 1.0 nm, for example. The nonmagnetic middle layer 32 is made of a nonmagnetic material containing at least one element selected from the group consisting of Ru, Rh, Ir, Re, Cr, Zr and Cu, for example. The nonmagnetic middle layer 32 is provided for producing antiferromagnetic exchange coupling between the inner layer 33 and the outer layer 31, and for fixing the magnetizations of the inner layer 33 and the outer layer 31 to opposite directions. It should be noted that the magnetizations of the inner layer 33 and the outer layer 31 in opposite directions include not only a case in which there is a difference of 180 degrees between these directions of magnetizations, but also a case in which there is a difference in the range of 180 plus/minus about 20 degrees between them.

The spacer layer 24 has a periphery 24a located in the peripheral surface 30c of the outer surface of the stack of layers 30. The spacer layer 24 includes: a first nonmagnetic metal layer 41 and a second nonmagnetic metal layer 43 each made of a nonmagnetic metal material; and a semiconductor layer 42 that is made of an oxide semiconductor composed of an oxide of a first metal and that is disposed between the first nonmagnetic metal layer 41 and the second nonmagnetic metal layer 43. The first nonmagnetic metal layer 41 touches the inner layer 33, while the second nonmagnetic metal layer 43 touches the free layer 25.

The first metal may be composed of at least one of Zn, In and Sn. Accordingly, the oxide semiconductor used for the semiconductor layer 42 may be composed of at least one of ZnO, $In_2O_3$ and $SnO_2$. ZnO is known to be turned into an n-type semiconductor by electrons released from interstitial zinc or oxygen vacancies. The oxide semiconductor used for the semiconductor layer 42 may be an oxide semiconductor including two or more metallic elements selected from Zn, In, and Sn. The semiconductor layer 42 has a thickness preferably within a range of 1 to 2 nm, and more preferably within a range of 1.2 to 1.8 nm.

The nonmagnetic metal material used for the nonmagnetic metal layers 41 and 43 can be one of Cu, Au, Ag, Zn, AuCu, CuZn, Cr, Ru, and Rh, for example. Of these, Cu, Au, and Ag are preferable, of which Cu is particularly preferable, as the nonmagnetic metal material used for the nonmagnetic metal layers 41 and 43. Each of the nonmagnetic metal layers 41 and 43 preferably has a thickness within a range of 0.3 to 2 nm.

The free layer 25 has a thickness of 2 to 10 nm, for example. The free layer 25 is formed of a ferromagnetic layer having a low coercivity. The free layer 25 may include a plurality of ferromagnetic layers stacked.

The protection layer 26 has a thickness of 0.5 to 20 nm, for example. The protection layer 26 may be formed of a Ta layer or a Ru layer, for example. The protection layer 26 may be formed into a two-layer structure made up of a combination of a Ta layer and a Ru layer, for example, or a three-layer structure made up of a combination of Ta, Ru and Ta layers or a combination of Ru, Ta and Ru layers, for example.

At least one of the inner layer 33 and the free layer 25 may include an alloy layer having a spin polarization nearly equal to 1, such as a Heusler alloy layer.

The plane geometry of each of the layers 21 to 26 constituting the stack of layers 30 is rectangular. The peripheral surface 30c of the stack of layers 30 is made up of the peripheries of the layers 21 to 26.

The insulating film 4 includes: a contact film 4A that touches the peripheral surface 30c of the stack of layers 30 including the periphery 24a of the spacer layer 24; and an inorganic insulating film 4B made of an inorganic insulating material and disposed such that the contact film 4A is sandwiched between the inorganic insulating film 4B and the peripheral surface 30c of the stack of layers 30 including the periphery 24a of the spacer layer 24. The contact film 4A preferably has a thickness of 1 nm or greater. It is not necessarily required that the insulating film 4 include the inorganic insulating film 4B.

The contact film 4A is made of an oxide of a second metal having a Pauling electronegativity (hereinafter simply referred to as an electronegativity) lower than that of the first metal used for the oxide semiconductor to form the semiconductor layer 42, by 0.1 or more. The second metal may be composed of at least one of Hf, Mg, Zr, Ta and Ti. Accordingly, the material of the contact film 4A may be composed of at least one of $HfO_2$, MgO, $ZrO_2$, $Ta_2O_5$ and $TiO_2$. The material of the contact film 4A may also be a metal oxide including two or more metallic elements selected from Hf, Mg, Zr, Ta and Ti, such as HfMgO.

Table 1 below provides a listing of oxides and electronegativities of some metallic elements.

TABLE 1

| Element | Oxide | Electronegativity |
|---|---|---|
| Zn | ZnO | 1.65 |
| In | $In_2O_3$ | 1.78 |
| Sn | $SnO_2$ | 1.96 |
| Ni | NiO | 1.91 |
| Si | $SiO_2$ | 1.90 |
| Al | $Al_2O_3$ | 1.61 |
| Hf | $HfO_2$ | 1.30 |
| Mg | MgO | 1.31 |
| Zr | $ZrO_2$ | 1.33 |
| Ta | $Ta_2O_5$ | 1.50 |
| Ti | $TiO_2$ | 1.54 |

As can be seen from Table 1 above, the electronegativity of each of Hf, Mg, Zr, Ta and Ti is lower than that of each of Zn, In and Sn by 0.1 or more. Therefore, when the first metal is composed of at least one of Zn, In and Sn, it is desirable that the second metal be composed of at least one of Hf, Mg, Zr, Ta and Ti. In other words, when the oxide semiconductor used for the semiconductor layer 42 is composed of at least one of ZnO, $In_2O_3$ and $SnO_2$, it is desirable that the material of the contact film 4A be composed of at least one of $HfO_2$, MgO, $ZrO_2$, $Ta_2O_5$ and $TiO_2$.

The inorganic insulating material used to form the inorganic insulating film 4B can be $Al_2O_3$ or $SiO_2$, for example.

The MR element 5 of the embodiment preferably has a resistance-area product (hereinafter referred to as RA) within a range of 0.1 to 0.3 $\Omega \cdot \mu m^2$.

A method of manufacturing the read head illustrated in FIG. 1 and FIG. 2 will now be described. In the method of manufacturing the read head, first, the first shield layer 3 having a predetermined pattern is formed on the insulating layer 2 by plating, for example. Next, on the first shield layer 3, films to become the respective layers constituting the stack of layers 30 are formed in succession by sputtering, for example, to thereby form a layered film. The film to become the semiconductor layer 42 may be formed by sputtering the material of the oxide semiconductor used to form the semiconductor layer 42, or by forming a film of the first metal by sputtering and then oxidizing this film of the first metal by an oxidation method such as plasma oxidation or natural oxidation.

Next, the foregoing layered film is subjected to heat treatment. This heat treatment is performed for the purpose of improving the crystallinity of the semiconductor layer 42 and directing the magnetization of the pinned layer 23 to one direction. The temperature of this heat treatment is preferably within a range of 200° C. to 300° C., and more preferably within a range of 250° C. to 290° C. Next, the layered film is patterned by etching to thereby form the stack of layers 30.

Next, the insulating film 4 is formed by sputtering, for example, to thereby complete the MR element 5. In the case where the insulating film 4 has only the contact film 4A, only the contact film 4A is formed in the step of forming the insulating film 4. In the case where the insulating film 4 includes the contact film 4A and the inorganic insulating film 4B, the contact film 4A is first formed and then the inorganic insulating film 4B is formed in the step of forming the insulating film 4.

Next, the bias magnetic field applying layers 6 are formed. Next, the second shield layer 8 is formed by plating or sputtering, for example, on the MR element 5 and the bias magnetic field applying layers 6.

The operation of the thin-film magnetic head of the embodiment will now be described. The thin-film magnetic head writes data on a recording medium by using the write head and reads data written on the recording medium by using the read head.

In the read head, the direction of the bias magnetic field produced by the bias magnetic field applying layers 6 intersects the direction perpendicular to the medium facing surface 20 at a right angle. In the MR element 5, when no signal magnetic field is present, the direction of magnetization of the free layer 25 is aligned with the direction of the bias magnetic field. On the other hand, the direction of magnetization of the pinned layer 23 is fixed to the direction perpendicular to the medium facing surface 20.

In the MR element 5, the direction of magnetization of the free layer 25 changes in response to a signal magnetic field sent from the recording medium. This causes a change in the relative angle between the direction of magnetization of the free layer 25 and the direction of magnetization of the pinned layer 23, and as a result, the resistance of the MR element 5 changes. The resistance of the MR element 5 can be determined from the potential difference between the first and second shield layers 3 and 8 produced when a sense current is fed to the MR element 5 from the shield layers 3 and 8. Thus, it is possible for the read head to read data stored on the recording medium.

In the MR element 5 of the embodiment, the spacer layer 24 includes the two nonmagnetic metal layers 41 and 43 and the semiconductor layer 42 disposed between the two layers. According to the embodiment, it is therefore possible for the MR element 5 to attain a greater RA and accordingly a greater resistance change amount, compared with a case where the spacer layer 24 does not include the semiconductor layer 42.

As will be seen from experimental results described later, in an MR element having an insulating layer made of $Al_2O_3$ instead of the insulating film 4 of the embodiment, there occurs the problem that the MR ratio is greatly reduced when heat is applied to the MR element after its fabrication. Occasions when heat is applied to the element after its fabrication include, for example, heat treatment for hardening photoresist to form the insulating layer 11 covering the coil 10 and heat treatment for hardening photoresist to form the insulating layer 16 covering the coil 15, which are performed in the process of fabricating the write head. Another occasion when heat is applied to the MR element after its fabrication is heating performed in a reliability test on the thin-film magnetic head. In the case of the MR element having an insulating layer of $Al_2O_3$ instead of the insulating film 4 of the embodiment as mentioned above, a possible reason why the MR ratio is greatly reduced when heat is applied to the MR element after its fabrication would be because, when heat is applied to the MR element, there occurs a transfer of elements such as oxygen from the semiconductor layer 42 made of an oxide semiconductor to the insulating layer, and this results in degradation in quality of the crystal of the semiconductor layer 42.

According to the embodiment, in contrast, the insulating film 4 includes the contact film 4A that touches the peripheral surface 30c of the stack of layers 30 including the periphery 24a of the spacer layer 24 and that is made of an oxide of the second metal whose electronegativity is lower than that of the first metal used for the oxide semiconductor that forms the semiconductor layer 42 by 0.1 or more. Electronegativity indicates the capability of atoms in a molecule to attract electrons. According to the embodiment, as will be seen from the experimental results described later, it is possible to suppress a reduction in MR ratio occurring when heat is applied to the MR element 5 after its fabrication. The reason why it is possible to suppress a reduction in MR ratio can be considered as follows. According to the embodiment, the insulating film 4 includes the contact film 4A satisfying the above-mentioned requirements, and this would make it possible to prevent a transfer of electrons accompanying the transfer of oxygen from the semiconductor layer 42 to the insulating film 4, and to thereby substantially suppress the transfer of oxygen. As a result, according to the embodiment, degradation in quality of the crystal of the semiconductor layer 42 would be suppressed, whereby a reduction in MR ratio would be suppressed.

A description will now be given of the results of an experiment performed for showing the effects of the embodiment. In the experiment, 17 types of MR element samples labeled as A1 to A14 and B1 to B3 were prepared. Each of the samples A1 to A14 corresponds to an example of the MR element 5 of the embodiment. Each of the samples B1 to B3 corresponds to a comparative example against the MR element 5 of the embodiment. Table 2 below shows the specific film configuration of the stack of layers 30 of the samples A1 to A14 and B1 to B3.

TABLE 2

| Layer | | Substance | Thickness (nm) |
|---|---|---|---|
| Protection layer | | Ru | 10 |
| Free layer | | NiFe | 5 |
| | | CoFe | 1 |
| Spacer layer | Second nonmagnetic metal layer | Cu | 0.7 |
| | Semiconductor layer | Oxide semiconductor | 1.6 or 1.7 |
| | First nonmagnetic metal layer | Cu | 0.7 |
| Pinned layer | Inner layer | CoFe | 3.5 |
| | Nonmagnetic middle layer | Ru | 0.8 |
| | Outer layer | CoFe | 3 |
| Antiferromagnetic layer | | IrMn | 5 |
| Underlying layer | | Ru | 2 |
| | | Ta | 1 |

In each of the samples B1 to B3, although the film that touches the peripheral surface 30c of the stack of layers 30 does not satisfy the requirements for the contact film of the present invention, this film is also called the contact film 4A for convenience in the following description. For each of the samples A1 to A14 and B1 to B3, Table 3 below lists the respective conditions under which the semiconductor layer 42 and the contact film 4A were formed. To be specific, Table 3 lists, as the conditions for the semiconductor layer 42, the material and thickness of the semiconductor layer 42, the first metal used in the material of the semiconductor layer 42 and the electronegativity of the first metal. Table 3 also lists, as the conditions for the contact film 4A, the material and thickness of the contact film 4A, the second metal used in the material of the contact film 4A and the electronegativity of the second metal.

TABLE 3

| | Conditions for semiconductor layer | | | | Conditions for contact film | | | |
|---|---|---|---|---|---|---|---|---|
| Sample | Material | Thickness (nm) | 1st metal | Electro-negativity | Material | Thickness (nm) | 2nd metal | Electro-negativity |
| A1 | ZnO | 1.6 | Zn | 1.65 | HfO$_2$ | 3.0 | Hf | 1.3 |
| A2 | ZnO | 1.6 | Zn | 1.65 | MgO | 3.0 | Mg | 1.31 |
| A3 | ZnO | 1.6 | Zn | 1.65 | ZrO$_2$ | 3.0 | Zr | 1.33 |
| A4 | ZnO | 1.6 | Zn | 1.65 | Ta$_2$O$_5$ | 3.0 | Ta | 1.5 |
| A5 | ZnO | 1.6 | Zn | 1.65 | TiO$_2$ | 3.0 | Ti | 1.54 |
| A6 | ZnO | 1.6 | Zn | 1.65 | HfMgO | 3.0 | Mg, Hf | 1.305 |
| B1 | ZnO | 1.6 | Zn | 1.65 | Al$_2$O$_3$ | 3.0 | Al | 1.61 |
| B2 | ZnO | 1.6 | Zn | 1.65 | NiO | 3.0 | Ni | 1.91 |
| A7 | ZnO | 1.6 | Zn | 1.65 | HfO$_2$ | 2.0 | Hf | 1.3 |
| A8 | ZnO | 1.6 | Zn | 1.65 | HfO$_2$ | 1.0 | Hf | 1.3 |
| B3 | ZnO | 1.6 | Zn | 1.65 | HfO$_2$ | 0.5 | Hf | 1.3 |
| A9 | In$_2$O$_3$ | 1.7 | In | 1.78 | HfO$_2$ | 3.0 | Hf | 1.3 |
| A10 | In$_2$O$_3$ | 1.7 | In | 1.78 | MgO | 3.0 | Mg | 1.31 |
| A11 | ITO | 1.7 | In, Sn | 1.81 | HfO$_2$ | 3.0 | Hf | 1.3 |
| A12 | ITO | 1.7 | In, Sn | 1.81 | MgO | 3.0 | Mg | 1.31 |
| A13 | SnO$_2$ | 1.7 | Sn | 1.96 | HfO$_2$ | 3.0 | Hf | 1.3 |
| A14 | SnO$_2$ | 1.7 | Sn | 1.96 | MgO | 3.0 | Mg | 1.31 |

In Table 3, for the sample A6, the electronegativity as a condition for the contact film 4A shows an electronegativity that is intermediate between the electronegativities of Mg and Hf. In Table 3, for each of the samples A11 and A12, the electronegativity as a condition for the semiconductor layer 42 shows an electronegativity that is intermediate between the electronegativities of In and Sn.

Each sample was fabricated as follows. First, films to become the respective layers constituting the stack of layers 30 were formed in succession by sputtering, for example, to thereby form a layered film. Next, this layered film was subjected to heat treatment. The heat treatment was performed at a temperature of 270° C. for three hours. Next, the layered film was patterned by etching to thereby form the stack of layers 30. Next, the contact film 4A and the inorganic insulating film 4B were formed in this order by sputtering to thereby complete each sample. The inorganic insulating film 4B is 40 nm in thickness.

In the experiment, MR ratio (%) and RA ($\Omega \cdot \mu m^2$) were measured for each sample. Next, each sample was subjected to a post-sample-fabrication heat treatment. The post-sample-fabrication heat treatment was performed at a temperature of 270° C. for three hours. The post-sample-fabrication heat treatment corresponds to an occasion when heat is applied to the MR element 5 after fabrication of the MR element 5. Next, MR ratio (%) and RA ($\Omega \cdot \mu m^2$) were again measured for each sample. Here, the state of each sample before undergoing the post-sample-fabrication heat treatment is called an "initial state", and the state of each sample after undergoing the post-sample-fabrication heat treatment is called a "post-heat-treatment state". Furthermore, in the experiment, the value of MR ratio in the post-heat-treatment state divided by the value of MR ratio in the initial state was obtained for each sample. The value thus obtained will be hereinafter called an "MR degradation rate". A lower MR degradation rate means a greater reduction in MR ratio resulting from the post-sample-fabrication heat treatment as compared with the initial state. Table 4 below lists the MR ratio and RA in the initial state, the MR ratio and RA in the post-heat-treatment state, and the MR degradation rate for each sample.

TABLE 4

| Sample | Initial state | | Post-heat-treatment state | | MR degradation rate |
|---|---|---|---|---|---|
| | MR ratio (%) | RA (Ω · μm$^2$) | MR ratio (%) | RA (Ω · μm$^2$) | |
| A1 | 14.8 | 0.209 | 14.8 | 0.209 | 1.00 |
| A2 | 14.7 | 0.197 | 14.7 | 0.201 | 1.00 |
| A3 | 14.7 | 0.190 | 14.6 | 0.192 | 0.99 |
| A4 | 13.8 | 0.188 | 12.6 | 0.172 | 0.91 |
| A5 | 12.8 | 0.192 | 11.6 | 0.175 | 0.91 |
| A6 | 14.8 | 0.202 | 14.8 | 0.203 | 1.00 |
| B1 | 12.5 | 0.213 | 9.8 | 0.164 | 0.78 |
| B2 | 11.7 | 0.201 | 8.8 | 0.155 | 0.75 |
| A7 | 14.9 | 0.215 | 14.8 | 0.209 | 0.99 |
| A8 | 14.5 | 0.204 | 14.2 | 0.187 | 0.98 |
| B3 | 12.8 | 0.211 | 10.5 | 0.172 | 0.82 |
| A9 | 13.8 | 0.188 | 13.7 | 0.190 | 0.99 |
| A10 | 13.5 | 0.179 | 13.5 | 0.180 | 1.00 |
| A11 | 14.0 | 0.193 | 13.9 | 0.192 | 0.99 |
| A12 | 13.8 | 0.185 | 13.6 | 0.183 | 0.99 |
| A13 | 13.6 | 0.180 | 13.6 | 0.180 | 1.00 |
| A14 | 13.5 | 0.172 | 13.4 | 0.173 | 0.99 |

The results of the experiment will now be discussed with reference to Table 3 and Table 4. First, comparisons are made among the samples A1 to A6, B1 and B2. As Table 3 indicates, these samples are different only in the material of the contact film 4A. In the samples B1 and B2, the second metal does not satisfy the requirement that the electronegativity thereof be lower than that of the first metal by 0.1 or more. In contrast, in the samples A1 to A6, the second metal satisfies the requirement that the electronegativity thereof be lower than that of the first metal by 0.1 or more. As Table 4 indicates, the samples B1 and B2 have MR degradation rates of 0.78 and 0.75, respectively. In contrast, the samples A1 to A6 have MR degradation rates within a range of 0.91 to 1.00. From these results, it can be seen that if the second metal satisfies the requirement that the electronegativity thereof be lower than that of the first metal by 0.1 or more, it is possible to suppress a reduction in MR ratio occurring when heat is applied to the MR element 5 after fabrication of the MR element 5.

Furthermore, as Table 4 indicates, the samples A1 to A6 are higher in MR ratio in the initial state than the samples B1 and B2. This is presumably because a transfer of oxygen from the semiconductor layer 42 to the insulating film 4 occurs in the samples B1 and B2 even before undergoing the post-sample-fabrication heat treatment, whereas such a transfer of oxygen can be prevented in the samples A1 to A6. This result indicates that, according to the embodiment, the second metal satisfying the requirement that the electronegativity thereof be lower than that of the first metal by 0.1 or more serves to suppress a reduction in MR ratio even in a case where no heat is applied to the MR element 5 after its fabrication.

Next, comparisons are made among the samples A7, A8 and B3. As Table 3 indicates, these samples are different only in thickness of the contact film 4A. The thicknesses of the contact film 4A of the samples A7, A8 and B3 are 2 nm, 1 nm and 0.5 nm, respectively. As Table 4 indicates, the MR ratios in the initial state of the samples A7, A8 and B3 are 14.9, 14.5 and 12.8, respectively, and the MR degradation rates of the samples A7, A8 and B3 are 0.99, 0.98 and 0.82, respectively. These results indicate that, if the thickness of the contact film 4A is too small, a reduction in MR ratio occurring when heat is applied to the MR element 5 after its fabrication cannot be sufficiently suppressed and there occurs a reduction in MR ratio even in the case where no heat is applied to the MR element 5 after its fabrication. From the experimental results on the samples A7, A8 and B3, it is expected that, if the thickness of the contact film 4A is 1 nm or greater, it is possible to sufficiently suppress a reduction in MR ratio occurring when heat is applied to the MR element 5 after its fabrication and it is also possible to sufficiently suppress a reduction in MR ratio even in the case where no heat is applied to the MR element 5 after its fabrication.

The experimental results on the samples A9 to A14 will now be described. The samples A9, A11 and A13 are different from the sample A1 in the material and thickness of the semiconductor layer 42. The samples A1, A12 and A14 are different from the sample A2 in the material and thickness of the semiconductor layer 42. The material of the semiconductor layer 42 in the samples A11 and A12 is indium tin oxide (ITO) formed by mixing $In_2O_3$ with 5 atomic percent $SnO_2$. In each of the samples A9 to A14, the second metal satisfies the requirement that the electronegativity thereof be lower than that of the first metal by 0.1 or more. Each of the samples A9 to A14 has an MR degradation rate of 0.99 or 1.00. The MR ratios in the initial state of the samples A9 to A14 are sufficiently higher than the MR ratios in the initial state of the samples B1 and B2. These results indicate that, according to the embodiment, it is possible to suppress a reduction in MR ratio occurring when heat is applied to the MR element 5 after its fabrication and it is also possible to suppress a reduction in MR ratio even in the case where no heat is applied to the MR element 5 after its fabrication, as long as the second metal satisfies the requirement that the electronegativity thereof be lower than that of the first metal by 0.1 or more, even if the combination of the first metal and the second metal varies.

Figure 5:
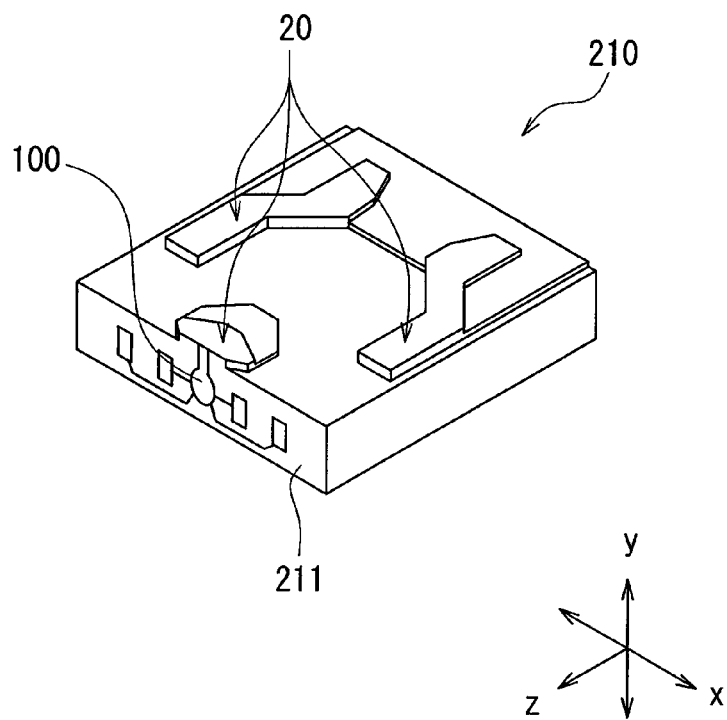
FIG. 5 is a perspective view illustrating a slider incorporated in a head gimbal assembly of the embodiment of the invention.

A head assembly and a magnetic disk drive of the embodiment will now be described. Reference is first made to FIG. 5 to describe a slider 210 incorporated in the head assembly. In the magnetic disk drive, the slider 210 is placed to face toward a magnetic disk platter that is a circular-plate-shaped recording medium to be driven to rotate. The slider 210 has a base body 211 made up mainly of the substrate 1 and the overcoat layer 17 of FIG. 3. The base body 211 is nearly hexahedron-shaped. One of the six surfaces of the base body 211 faces toward the magnetic disk platter. The medium facing surface 40 is formed in this one of the surfaces. When the magnetic disk platter rotates in the z direction of FIG. 5, an airflow passes between the magnetic disk platter and the slider 210, and a lift is thereby generated below the slider 210 in the y direction of FIG. 5 and exerted on the slider 210. The slider 210 flies over the surface of the magnetic disk platter by means of the lift. The x direction of FIG. 5 is across the tracks of the magnetic disk platter. The thin-film magnetic head 100 of the embodiment is formed near the air-outflow-side end (the end located at the lower left of FIG. 5) of the slider 210.

Figure 6:
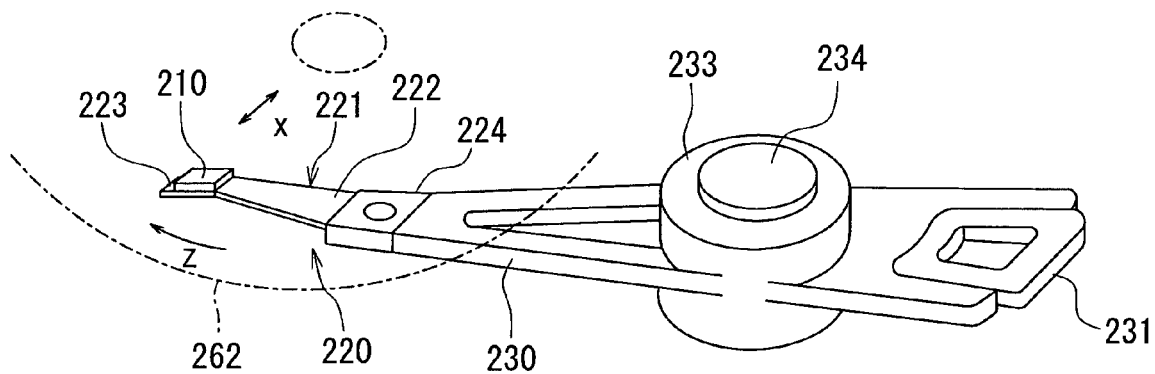
FIG. 6 is a perspective view illustrating a head arm assembly of the embodiment of the invention.

Reference is now made to FIG. 6 to describe the head assembly of the embodiment. The head assembly of the embodiment has the slider 210 and a supporter that flexibly supports the slider 210. Forms of this head assembly include a head gimbal assembly and a head arm assembly described below.

The head gimbal assembly 220 will be first described. The head gimbal assembly 220 has the slider 210 and a suspension 221 as the supporter that flexibly supports the slider 210. The suspension 221 has: a plate-spring-shaped load beam 222 made of stainless steel, for example; a flexure 223 to which the slider 210 is joined, the flexure 223 being located at an end of the load beam 222 and giving an appropriate degree of freedom to the slider 210; and a base plate 224 located at the other end of the load beam 222. The base plate 224 is attached to an arm 230 of an actuator for moving the slider 210 along the x direction across the tracks of the magnetic disk platter 262. The actuator has the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly including the arm 230 and the head gimbal assembly 220 attached to the arm 230 is called a head arm assembly. An assembly including a carriage having a plurality of arms wherein the head gimbal assembly 220 is attached to each of the arms is called a head stack assembly.

FIG. 6 illustrates the head arm assembly of the embodiment. In the head arm assembly, the head gimbal assembly 220 is attached to an end of the arm 230. A coil 231 that is part of the voice coil motor is fixed to the other end of the arm 230. A bearing 233 is provided in the middle of the arm 230. The bearing 233 is attached to a shaft 234 that rotatably supports the arm 230.

Figure 7:
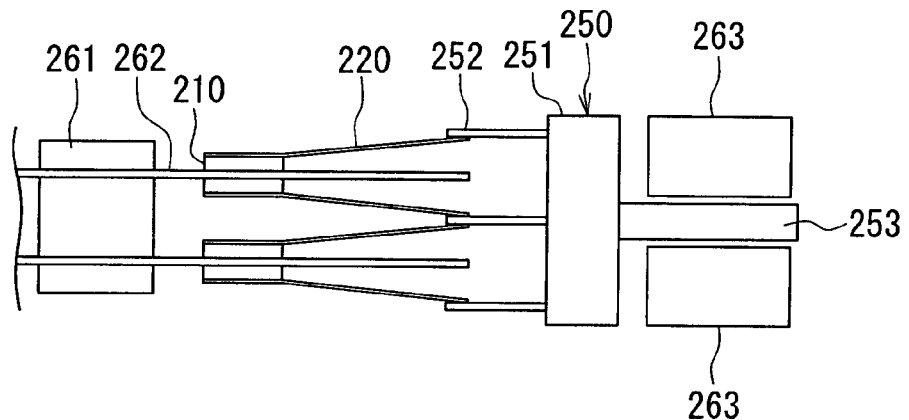
FIG. 7 is an explanatory view for illustrating the main part of a magnetic disk drive of the embodiment of the invention.
Figure 8:
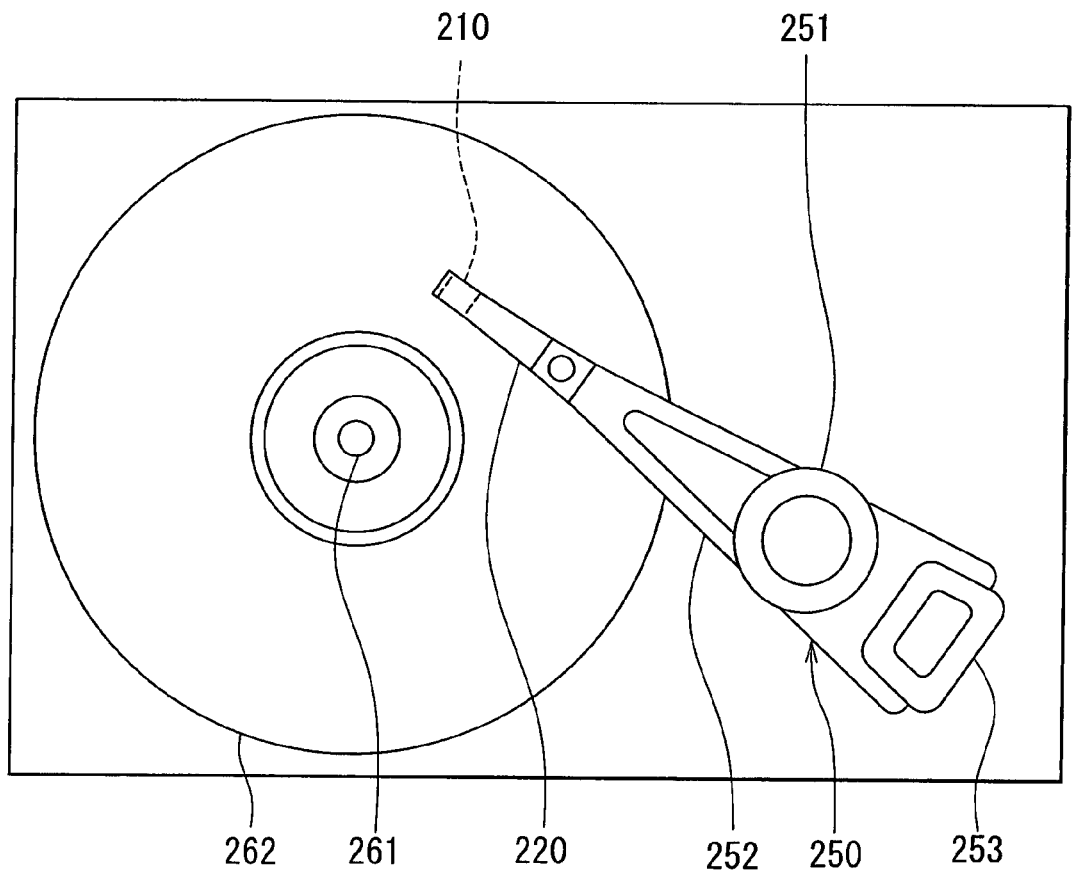
FIG. 8 is a top view of the magnetic disk drive of the embodiment of the invention.

Reference is now made to FIG. 7 and FIG. 8 to describe an example of the head stack assembly and the magnetic disk drive of the embodiment. FIG. 7 is an explanatory view illustrating the main part of the magnetic disk drive, and FIG. 8 is a top view of the magnetic disk drive. The head stack assembly 250 incorporates a carriage 251 having a plurality of arms 252. A plurality of head gimbal assemblies 220 are attached to the arms 252 such that the assemblies 220 are arranged in the vertical direction with spacing between respective adjacent ones. A coil 253 that is part of the voice coil motor is mounted on the carriage 251 on a side opposite to the arms 252. The head stack assembly 250 is installed in the magnetic disk drive. The magnetic disk drive includes a plurality of magnetic disk platters 262 mounted on a spindle motor 261. Two of the sliders 210 are allocated to each of the platters 262, such that the two sliders 210 are opposed to each other with each of the platters 262 disposed in between. The voice coil motor includes permanent magnets 263 disposed to be opposed to each other, the coil 253 of the head stack assembly 250 being placed between the magnets 263.

The actuator and the head stack assembly 250 except the sliders 210 correspond to the alignment device of the invention, and support the sliders 210 and align them with respect to the magnetic disk platters 262.

In the magnetic disk drive of the embodiment, the actuator moves the slider 210 across the tracks of the magnetic disk platter 262 and aligns the slider 210 with respect to the magnetic disk platter 262. The thin-film magnetic head incorporated in the slider 210 writes data on the magnetic disk platter 262 by using the write head, and reads data stored on the magnetic disk platter 262 by using the read head.

The head assembly and the magnetic disk drive of the embodiment exhibit effects similar to those of the thin-film magnetic head of the embodiment described previously.

The present invention is not limited to the foregoing embodiment but various modifications are possible. For example, the pinned layer 23 is not limited to a synthetic pinned layer. In addition, while the embodiment has been described with reference to a thin-film magnetic head having a structure in which the read head is formed on the base body and the write head is stacked on the read head, the read head and the write head may be stacked in the reverse order.

When the thin-film magnetic head is to be used only for read operations, the magnetic head may be configured to include the read head only.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A magnetoresistive element comprising a stack of layers including a first ferromagnetic layer, a second ferromagnetic layer, and a spacer layer disposed between the first ferromagnetic layer and the second ferromagnetic layer, wherein:

a current for detecting magnetic signals is fed in a direction intersecting a plane of each of the foregoing layers;

the stack of layers has an outer surface; and the spacer layer has a periphery located in the outer surface of the stack of layers;

the magnetoresistive element further comprising an insulating film that touches the periphery of the spacer layer, wherein:

the spacer layer includes a layer made of an oxide semiconductor composed of an oxide of a first metal;

the first metal is composed of at least one of Zn, In and Sn;

the insulating film includes a contact film that touches the periphery of the spacer layer and that is made of an oxide of a second metal having a Pauling electronegativity lower than that of the first metal by 0.1 or more;

the second metal is composed of at least one of Hf, Mg, Zr, Ta and Ti; and the magnetoresistive element has a resistance-area product within a range of 0.1 to 0.3 $\Omega \cdot \mu m^2$.

2. The magnetoresistive element according to claim 1, wherein the first ferromagnetic layer is a free layer having a direction of magnetization that changes in response to an external magnetic field, while the second ferromagnetic layer is a pinned layer having a fixed direction of magnetization.

3. The magnetoresistive element according to claim 1, wherein the insulating film further includes an inorganic insulating film made of an inorganic insulating material and disposed such that the contact film is sandwiched between the inorganic insulating film and the periphery of the spacer layer.

4. The magnetoresistive element according to claim 1, wherein the contact film has a thickness of 1 nm or greater.

5. A thin-film magnetic head comprising: a medium facing surface that faces toward a recording medium; a magnetoresistive element disposed near the medium facing surface to detect a signal magnetic field sent from the recording medium; and a pair of electrodes for feeding a current for detecting magnetic signals to the magnetoresistive element, wherein:

the magnetoresistive element comprises a stack of layers including a first ferromagnetic layer, a second ferromagnetic layer, and a spacer layer disposed between the first ferromagnetic layer and the second ferromagnetic layer;

in the magnetoresistive element, the current for detecting magnetic signals is fed in a direction intersecting a plane of each of the foregoing layers;

the stack of layers has an outer surface;

the spacer layer has a periphery located in the outer surface of the stack of layers;

the magnetoresistive element further comprises an insulating film that touches the periphery of the spacer layer;

the spacer layer includes a layer made of an oxide semiconductor composed of an oxide of a first metal;
the first metal is composed of at least one of Zn, In and Sn;
the insulating film includes a contact film that touches the periphery of the spacer layer and that is made of an oxide of a second metal having a Pauling electronegativity lower than that of the first metal by 0.1 or more;
the second metal is composed of at least one of Hf, Mg, Zr, Ta and Ti; and
the magnetoresistive element has a resistance-area product within a range of 0.1 to 0.3 $\Omega \cdot \mu m^2$.

6. A thin-film magnetic head comprising a medium facing surface that faces toward a recording medium, a read head, and a write head, wherein:
the read head comprises a magnetoresistive element disposed near the medium facing surface to detect a signal magnetic field sent from the recording medium, and a pair of electrodes for feeding a current for detecting magnetic signals to the magnetoresistive element;
the magnetoresistive element comprises a stack of layers including a first ferromagnetic layer, a second ferromagnetic layer, and a spacer layer disposed between the first ferromagnetic layer and the second ferromagnetic layer;
in the magnetoresistive element, the current for detecting magnetic signals is fed in a direction intersecting a plane of each of the foregoing layers;
the stack of layers has an outer surface;
the spacer layer has a periphery located in the outer surface of the stack of layers;
the magnetoresistive element further comprises an insulating film that touches the periphery of the spacer layer;
the spacer layer includes a layer made of an oxide semiconductor composed of an oxide of a first metal;
the first metal is composed of at least one of Zn, In and Sn;
the insulating film includes a contact film that touches the periphery of the spacer layer and that is made of an oxide of a second metal having a Pauling electronegativity lower than that of the first metal by 0.1 or more;
the second metal is composed of at least one of Hf, Mg, Zr, Ta and Ti; and
the magnetoresistive element has a resistance-area product within a range of 0.1 to 0.3 $\Omega \cdot \mu m^2$.

7. A method of manufacturing a thin-film magnetic head, the thin-film magnetic head comprising a medium facing surface that faces toward a recording medium, a read head, and a write head, wherein:
the read head comprises a magnetoresistive element disposed near the medium facing surface to detect a signal magnetic field sent from the recording medium, and a pair of electrodes for feeding a current for detecting magnetic signals to the magnetoresistive element;
the magnetoresistive element comprises a stack of layers including a first ferromagnetic layer, a second ferromagnetic layer, and a spacer layer disposed between the first ferromagnetic layer and the second ferromagnetic layer;
in the magnetoresistive element, the current for detecting magnetic signals is fed in a direction intersecting a plane of each of the foregoing layers;
the stack of layers has an outer surface;
the spacer layer has a periphery located in the outer surface of the stack of layers;
the magnetoresistive element further comprises an insulating film that touches the periphery of the spacer layer;
the spacer layer includes a layer made of an oxide semiconductor composed of an oxide of a first metal;
the first metal is composed of at least one of Zn, In and Sn;
the insulating film includes a contact film that touches the periphery of the spacer layer and that is made of an oxide of a second metal having a Pauling electronegativity lower than that of the first metal by 0.1 or more;
the second metal is composed of at least one of Hf, Mg, Zr, Ta and Ti; and
the magnetoresistive element has a resistance-area product within a range of 0.1 to 0.3 $\mu \cdot \mu m^2$,
the method comprising the steps of:
forming the read head; and
forming the write head after the read head is formed,
wherein the step of forming the write head includes the step of performing heat treatment.

8. A head assembly comprising: a slider including a thin-film magnetic head and disposed to face toward a recording medium; and a supporter flexibly supporting the slider, wherein:
the thin-film magnetic head comprises: a medium facing surface that faces toward the recording medium; a magnetoresistive element disposed near the medium facing surface to detect a signal magnetic field sent from the recording medium; and a pair of electrodes for feeding a current for detecting magnetic signals to the magnetoresistive element;
the magnetoresistive element comprises a stack of layers including a first ferromagnetic layer, a second ferromagnetic layer, and a spacer layer disposed between the first ferromagnetic layer and the second ferromagnetic layer;
in the magnetoresistive element, the current for detecting magnetic signals is fed in a direction intersecting a plane of each of the foregoing layers;
the stack of layers has an outer surface;
the spacer layer has a periphery located in the outer surface of the stack of layers;
the magnetoresistive element further comprises an insulating film that touches the periphery of the spacer layer;
the spacer layer includes a layer made of an oxide semiconductor composed of an oxide of a first metal;
the first metal is composed of at least one of Zn, In and Sn;
the insulating film includes a contact film that touches the periphery of the spacer layer and that is made of an oxide of a second metal having a Pauling electronegativity lower than that of the first metal by 0.1 or more;
the second metal is composed of at least one of Hf, Mg, Zr, Ta and Ti; and
the magnetoresistive element has a resistance-area product within a range of 0.1 to 0.3 $\Omega \cdot \mu m^2$.

9. A magnetic disk drive comprising: a slider including a thin-film magnetic head and disposed to face toward a recording medium that is driven to rotate; and an alignment device supporting the slider and aligning the slider with respect to the recording medium, wherein:
the thin-film magnetic head comprises: a medium facing surface that faces toward the recording medium; a magnetoresistive element disposed near the medium facing surface to detect a signal magnetic field sent from the recording medium; and a pair of electrodes for feeding a current for detecting magnetic signals to the magnetoresistive element;
the magnetoresistive element comprises a stack of layers including a first ferromagnetic layer, a second ferromagnetic layer, and a spacer layer disposed between the first ferromagnetic layer and the second ferromagnetic layer;
in the magnetoresistive element, the current for detecting magnetic signals is fed in a direction intersecting a plane of each of the foregoing layers;
the stack of layers has an outer surface;

the spacer layer has a periphery located in the outer surface of the stack of layers;

the magnetoresistive element further comprises an insulating film that touches the periphery of the spacer layer;

the spacer layer includes a layer made of an oxide semiconductor composed of an oxide of a first metal;

the first metal is composed of at least one of Zn, In and Sn;

the insulating film includes a contact film that touches the periphery of the spacer layer and that is made of an oxide of a second metal having a Pauling electronegativity lower than that of the first metal by 0.1 or more;

the second metal is composed of at least one of Hf, Mg, Zr, Ta and Ti; and the magnetoresistive element has a resistance-area product within a range of 0.1 to 0.3 $\Omega \cdot \mu m_2$.

* * * * *